(12) United States Patent
Miyamoto

(10) Patent No.: US 6,512,686 B2
(45) Date of Patent: Jan. 28, 2003

(54) FERROELECTRIC STORAGE DEVICE AND TEST METHOD THEREOF

(75) Inventor: Yasuo Miyamoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/864,651

(22) Filed: May 23, 2001

(65) Prior Publication Data
US 2002/0031004 A1 Mar. 14, 2002

(30) Foreign Application Priority Data
May 25, 2000 (JP) .......................... 2000-155486

(51) Int. Cl.[7] .............................................. G11C 11/22
(52) U.S. Cl. ..................... 365/145; 365/201; 365/210
(58) Field of Search ................................ 365/145, 201, 365/210

(56) References Cited

U.S. PATENT DOCUMENTS

| | | | | |
|---|---|---|---|---|
| 5,572,459 A | * | 11/1996 | Wilson et al. ............... | 365/145 |
| 5,953,277 A | * | 9/1999 | Mukunoki et al. ........... | 365/210 |
| 6,125,051 A | * | 9/2000 | Kang ........................... | 365/145 |
| 6,188,599 B1 | * | 2/2001 | Kang ........................... | 365/145 |
| 6,341,082 B2 | * | 1/2002 | Hosoi ........................... | 365/145 |

FOREIGN PATENT DOCUMENTS

JP   11-149796   6/1999

* cited by examiner

*Primary Examiner*—Richard Elms
*Assistant Examiner*—Tuan T. Nguyen
(74) *Attorney, Agent, or Firm*—Morrison & Foerster LLP

(57) ABSTRACT

A ferroelectric storage device comprises a memory cell including a first ferroelectric capacitor and connected to a first bit line, wherein the memory cell memorizes data based on a polarization of the first ferroelectric capacitor, and the memory cell outputs a first amount of electric charge generated by a change in the polarization of the first ferroelectric capacitor to the first bit line in reading out the data, a reference cell including a second ferroelectric capacitor and connected to a second bit line, wherein the reference cell outputs as a reference level a second amount of electric charge generated by a change in the polarization of the second ferroelectric capacitor to the second bit line, an amplifier for comparing the first amount of electric charge with the second amount of electric charge to read out data, first amount-of-electric-charge setting section for setting the first amount of electric charge to an arbitrary level, and a second amount-of-electric-charge setting section for setting the second amount of electric charge to an arbitrary level.

21 Claims, 11 Drawing Sheets

FIG. 3
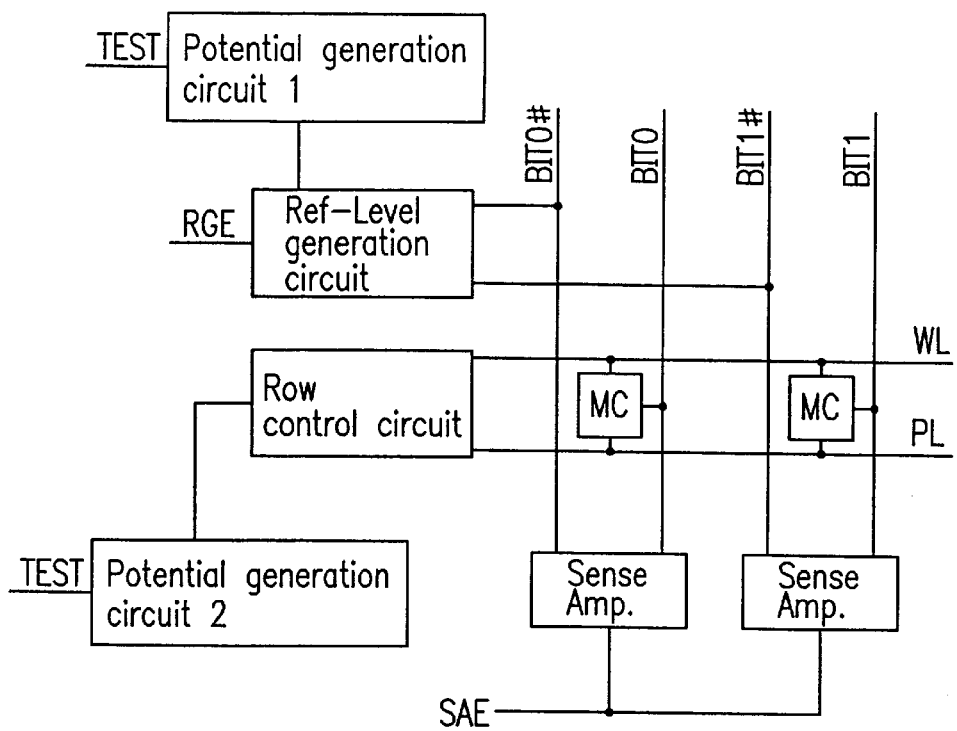
FIG. 4
WL
Potential of pulse for PL is controlled
by potential generation circuits 1
PL  Readout pulse    Rewrite pulse
Potential generated by Ref_Level generation
circuit is controlled by potential generation circuit 1
RGE
SAE

300

400

FIG. 6
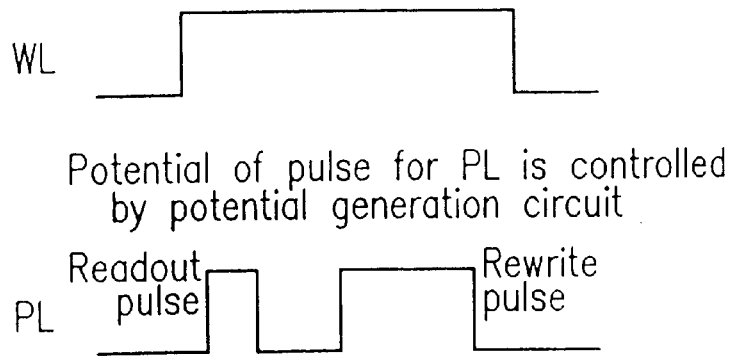
FIG. 7 "Prior Art"
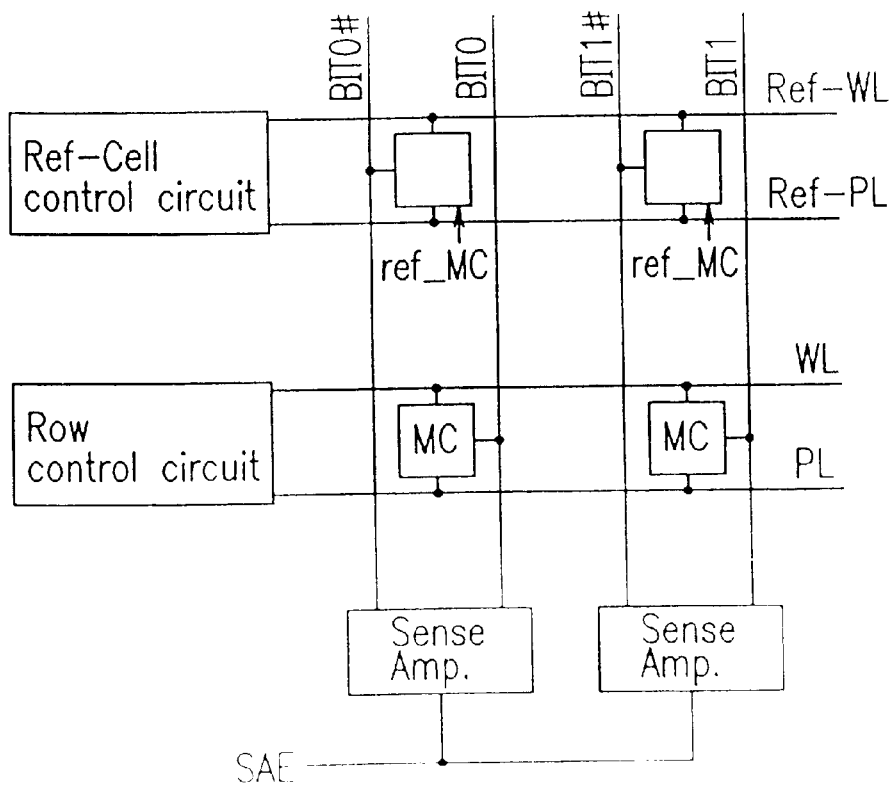

FIG. 8 "Prior Art"
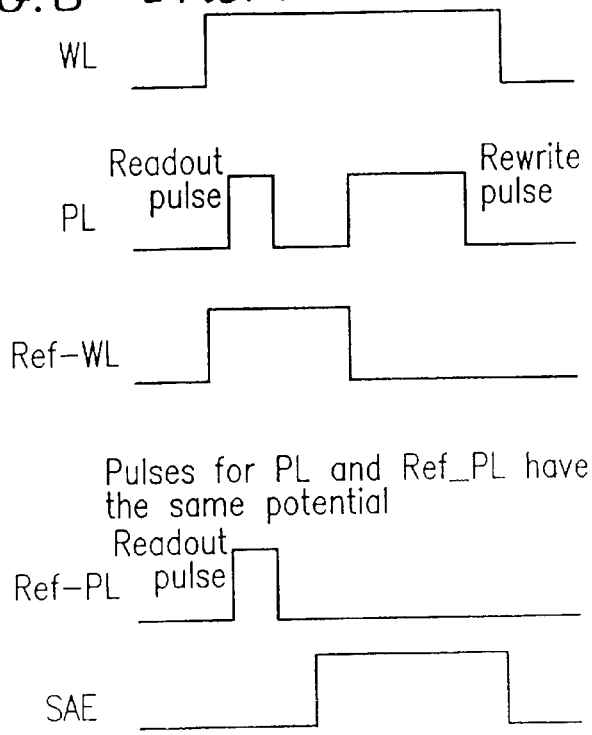
FIG. 9 "Prior Art"
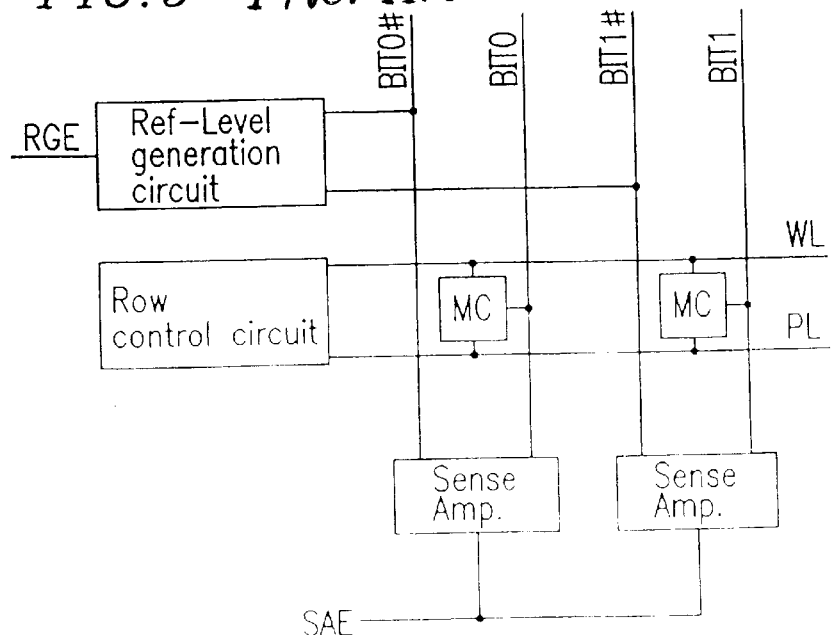

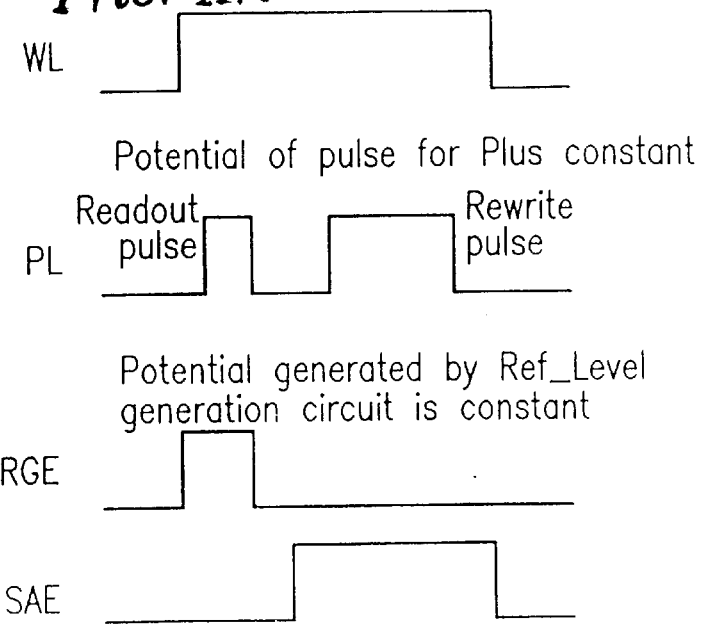
FIG. 10 "Prior Art"
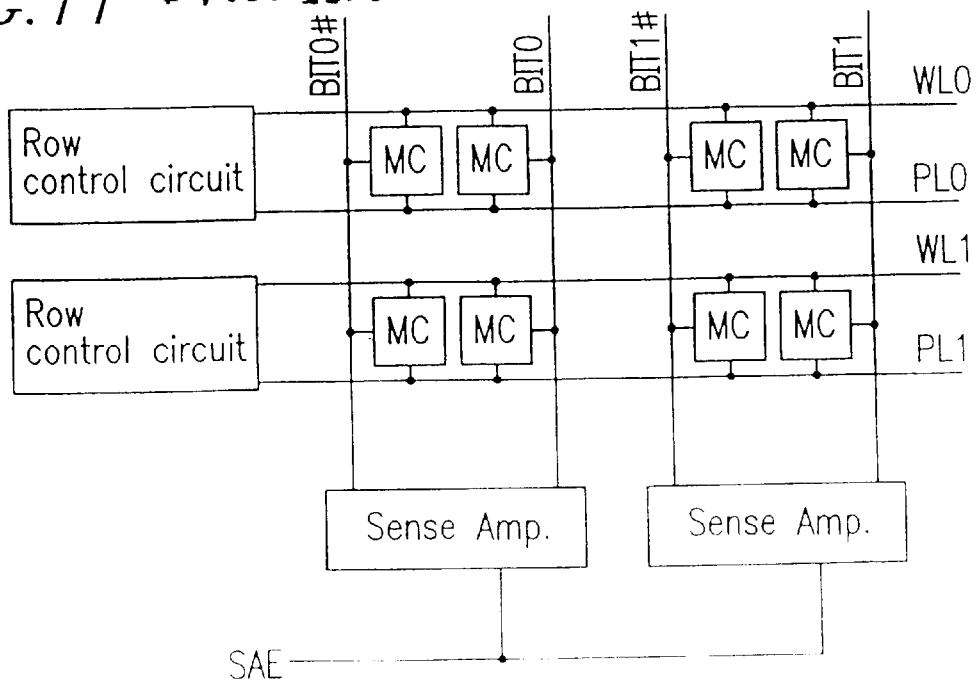
FIG. 11 "Prior Art"

FIG. 12 "Prior Art"
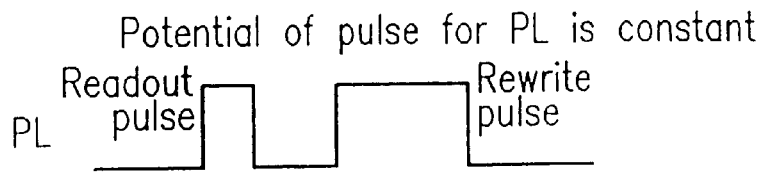
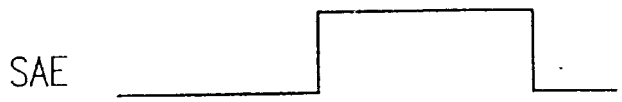
FIG. 13 "Prior Art"
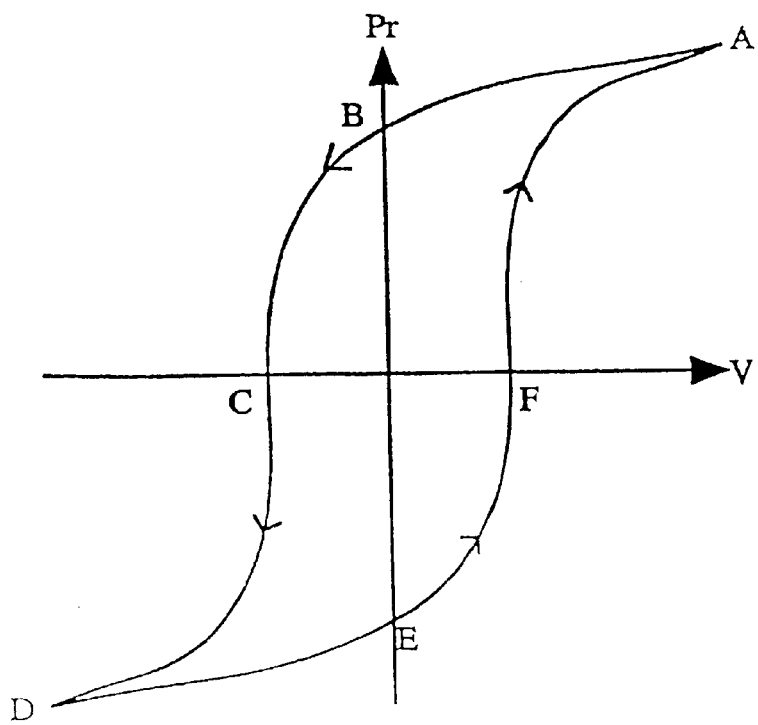

FIG. 14 *"Prior Art"*
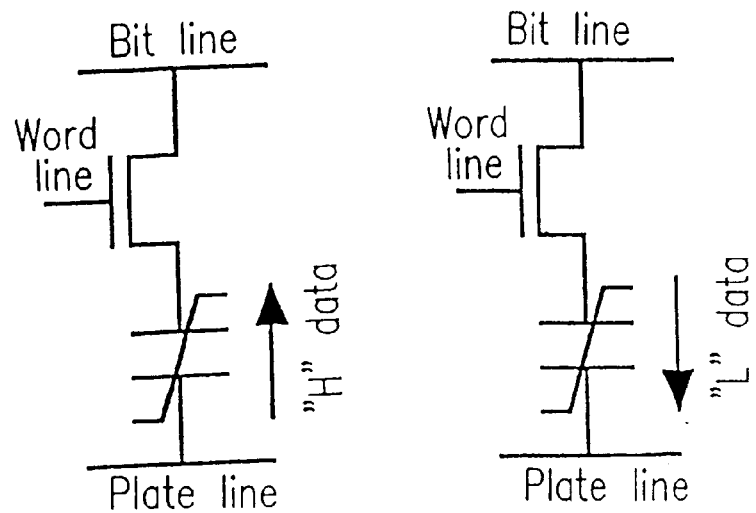
FIG. 15 *"Prior Art"*
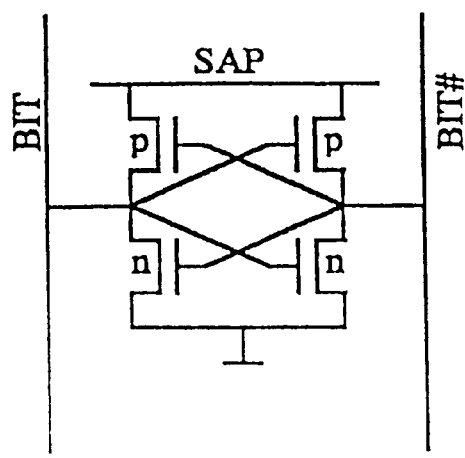
1500

FIG.16 "Prior Art"
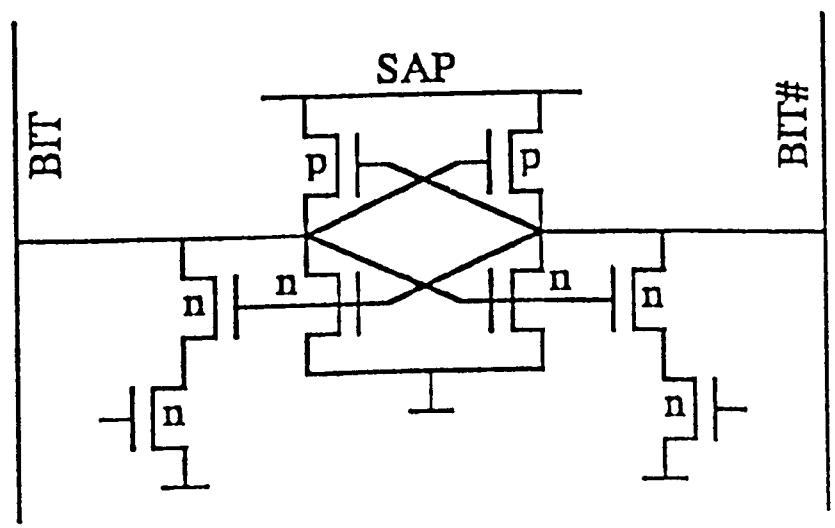
1600

FERROELECTRIC STORAGE DEVICE AND TEST METHOD THEREOF

BACKGROUND OF THE INVENTION

1. Field of the Invention

The present invention relates to a ferroelectric storage device and a test method thereof. More particularly, the present invention relates to a ferroelectric storage device which includes a memory element (memory cell) including a switching transistor and a ferroelectric capacitor and which memorizes information depending on a polarization direction of the ferroelectric capacitor, and a test method thereof.

2. Description of the Related Art

FIG. 13 shows a hysteresis loop exhibiting a characteristic of a ferroelectric capacitor. The horizontal axis indicates a voltage V applied between both electrode ends of the ferroelectric capacitor. The vertical axis indicates the amount of polarization Pr. A ferroelectric memory utilizing the hysteresis characteristic of the ferroelectric capacitor is used as a non-volatile memory, and a variety of its applications are currently proposed.

FIG. 14 shows a structure of a memory cell of a ferroelectric storage device. A memory storage operation of the memory cell will be described with reference to FIG. 13.

When "H" data is written to the memory cell, a bit line is transitioned to the "H" level and a plate line is transitioned to the "L" level while a word line is transitioned to the "H" level so that a MOS transistor is in the ON state. The polarization state of a ferroelectric capacitor in this situation is indicated by A in FIG. 13. When the bit line is transitioned to the "L" level, the potential of the ferroelectric capacitor is zero volts, but the polarization remains (this state is indicated by B in FIG. 13).

When "L" data is written to the memory cell, the bit line is transitioned to the "L" level and the plate line is transitioned to the "H" level while the word line is transitioned to the "H" level so that the MOS transistor is in the ON state. The polarization state of a ferroelectric capacitor in this situation is indicated by D in FIG. 13. Thereafter, when the plate line is transitioned to the "L" level, the voltage applied to the ferroelectric capacitor is zero volts, but an inverted polarization remains (this state is indicated by E in FIG. 13).

To read out information, the bit line is transitioned to the "L" level and a pulse of "L" to "H" to "L" is applied to the plate line while the word line is transitioned to the "H" level so that the MOS transistor is in the ON state. In this case, the ferroelectric capacitor in which the "H" data is written is transitioned to B to C to D to E, so that the polarization is inverted. In contrast, the ferroelectric capacitor in which the "L" data is written is transitioned to E to D to E, so that the polarization is not changed.

Thus, in the ferroelectric capacitor, a destructive readout is executed which leads to a change in information in the memory cell due to the readout operation. The change of the polarization causes a change in the amount of electric charge output from the ferroelectric capacitor, which appears as a small difference in potential in the bit line. Such a small difference in potential is amplified by a sense amplifier (not shown) so as to be read out as data.

A ferroelectric capacitor is categorized into the following two types: a ferroelectric memory (hereinafter referred to as a "1T1C-type ferroelectric memory") in which one memory cell includes one transistor and one ferroelectric capacitor; and a ferroelectric memory (hereinafter referred to as a "2T2C-type ferroelectric memory") in which one memory cell includes two transistors and two ferroelectric capacitors.

FIG. 7 shows a circuit of a conventional 1T1C-type ferroelectric memory 700. The 1T1C-type ferroelectric memory 700 includes a memory cell MC which is shown in FIG. 14. The memory cell MC is connected to a word line WL, a plate line PL, a bit line BIT0, and a bit line BIT1. The 1T1C-type ferroelectric memory 700 includes a memory cell ref_MC for generating a reference potential which is used as a reference used in determining whether data written in the memory cell MC is the "H" data or the "L" data. The memory cell ref_MC is connected to a reference word line Ref_WL, a reference plate line Ref_PL, bit lines BIT0 and BIT1, and bit lines BIT0# and BIT1# paired with the respective bit lines BIT0 and BIT1. The reference memory cell ref_MC outputs data having an intermediate level between the "H" data and the "L" data output from the memory cell MC, by short-circuiting an output of the memory cell MC in which the "H" data is written and an output of the memory cell MC in which the "L" data is written.

FIG. 8 is a timing chart used for explaining an operation of the conventional 1T1C-type ferroelectric memory 700. Initially, using a Row control circuit and a Ref_Cell control circuit, the word line WL and the reference word line Ref_WL are transitioned to the "H" level, and then pulses (readout pulses) are applied to the plate line PL and the reference plate line Ref_PL. In this case, pulses having the same potential are applied to the respective plate line PL and plate line Ref_PL. When, using a Row control circuit and a Ref_Cell control circuit, the word line WL and the reference word line Ref_WL are transitioned to the "H" level, and then pulses (readout pulses) are applied to the plate line PL and the reference plate line Ref_PL, the "H" data or the "L" data is output from the memory cell MC to the bit lines BIT0 and BIT1. Similarly, data having a reference level is output from the reference memory cell Ref_MC to the bit lines BIT0# and BIT1#. Thereafter, an SAE (Sense Amp. Enable) is transitioned to the "H" level so that the sense amplifier (Sense Amp.) is actuated and the potential difference between both bit lines is amplified.

Such data is read out in reading out information (the operation is hereinafter also referred to as a "READ operation"). To avoid a destructive readout of information from a storage device, a rewrite operation is performed in the memory cell MC using a rewrite pulse. In writing information (the operation is hereinafter referred to as a "WRITE operations"), the difference in potential between both bit lines is amplified, and thereafter write data (data to be written) is transferred to a bit line before the rewrite pulse is applied to the memory cell MC. Thereafter, the data is written to the memory cell MC using the rewrite pulse. When a READ or WRITE operation to the memory cell MC is performed in the 1T1C-type ferroelectric memory 700, the "L" level of a pulse applied to a plate line is typically zero volts and the "H" level is typically VCC. During the time that the rewrite operation is executed using the rewrite pulse, the reference word line Ref_WL is transitioned to the "L" level so that the reference cell Ref_MC is cut off a bit line, and initial data for generating data having the reference level is written to the reference cell Ref_MC. For example, the reference memory cell ref_MC generates data having the reference level by generating data having an intermediate level between the "H" data and the "L" data output from the memory cell MC. The intermediate-level data is obtained by short-circuiting an output of the memory cell MC in which the "H" data is written and an output of the memory cell MC in which the "L" data is written. In this case, the "H" data and the "L" data are written to difference memory cells in order to cause the reference memory cell ref_MC to generate the reference-level data.

FIG. 9 shows another conventional 1T1C-type ferroelectric memory 900. The 1T1C-type ferroelectric memory 900 includes a Ref_Level generation circuit in order to generate a reference voltage instead of the reference memory cell ref_MC included in the 1T1C-type ferroelectric memory 700. The Ref_Level generation circuit divides a resistance between VCC and GND so that data having an intermediate level between the "H" data and the "L" data can be output.

FIG. 10 is a timing chart used for explaining another conventional 1T1C-type ferroelectric memory 900. Initially, the word line WL is transitioned to the "H" level by the Row control circuit, and a pulse (read pulse) is applied to the plate line PL. Thereby, the "H" or "L" data is output to the bit lines BIT0 and BIT1. Further, the RGE (Ref_Level generation circuit enable) is transitioned to the "H" level so that the Ref_Level generation circuit is enabled, and data having a reference level is output to the bit lines BIT0 and BIT1. Thereafter, the SAE is transitioned to the "H" level so that the sense amplifier (Sense Amp.) is actuated. The difference in potential between both bit lines is amplified by the sense amplifier.

Such data is read out in a READ operation. A rewrite operation is performed in the memory cell MC using a rewrite pulse. In a WRITE operation, the difference in potential between both bit lines is amplified, and thereafter write data is transferred to a bit line before the rewrite pulse is applied to the memory cell MC. Thereafter, the data is written to the memory cell MC using the rewrite pulse. When a READ or WRITE operation to the memory cell MC is performed in the 1T1C-type ferroelectric memory 900, the "L" level of a pulse applied to a plate line is typically zero volts and the "H" level is typically VCC.

FIG. 11 shows a conventional 2T2C-type ferroelectric memory 1100. The 2T2C-type ferroelectric memory 1100 includes a memory cell MC of FIG. 14. The memory cell MC is connected to a word line WL0 and a plate line PL0, or a word line WL1 and a plate line PL1. The 2T2C-type ferroelectric memory 1100 includes two memory cells MC. One of the two memory cells MC is connected to a bit line BIT0 or BIT1. The other is connected to a bit lines BIT0# or BIT1# paired with the respective bit line BIT0 or BIT1.

FIG. 12 is a timing chart used for explaining an operation of the 2T2C-type ferroelectric memory 1100. Initially, the word line WL0 (or WL1) is transitioned to the "H" level by the Row control circuit, and a pulse (read pulse) is applied to a plate line PL0 (or PL1). Thereby, the "H" or "L" data is output from one memory cell MC to bit line BIT0 or BIT1. The reverse data is output from the other memory cell MC to bit line BIT0# or BIT1#. Thereafter, the SAE is transitioned to the "H" level so that the sense amplifier (Sense Amp.) is actuated. The difference in potential between both bit lines is amplified by the sense amplifier.

Such data is read out in a READ operation. A rewrite operation is performed in the memory cell MC using a rewrite pulse. In a WRITE operation, the difference in potential between both bit lines is amplified, and thereafter write data is transferred to a bit line before the rewrite pulse is applied to the memory cell MC. Thereafter, the data is written to the memory cell MC using the rewrite pulse. When a READ or WRITE operation to the memory cell MC is performed in the 2T2C-type ferroelectric memory 1100, the "L" level of a pulse applied to a plate line is typically zero volts and the "H" level is typically VCC.

A characteristic of a ferroelectric capacitor is important for both 1T1C-type and 2T2C-type ferroelectric memories. There are variations in the characteristic of the ferroelectric capacitor due to a manufacturing process. Further, the characteristic of the ferroelectric capacitor is significantly unstable compared with other memories (DRAM, SRAM, etc.). Therefore, to ensure reliability and operation stability equal to those of other memories, a quality test more stringent than that for the other memories is required for a ferroelectric memory.

Therefore, for example, Japanese Laid-open Publication No. 11-149796 discloses the following method. An offset is provided in a sense amplifier so as to detect a memory cell in which only a potential less than or equal to the offset can be detected. Thereby, a ferroelectric storage device including a memory cell having a small readout margin can be detected in advance.

FIG. 15 shows a typical latch sense amplifier 1500. FIG. 16 shows a latch sense amplifier 1600 described in Japanese Laid-open Publication No. 11-149796. The latch sense amplifiers 1500 and 1600 each includes a pair of bit lines BIT and BIT#, a sense amplifier SAP, an n-type transistor n, and a p-type transistor p.

However, the latch sense amplifier 1600 consists of eight elements. Therefore, the area of the latch sense amplifier 1600 is larger than the typical latch sense amplifier 1500 consisting of four elements. One latch sense amplifier 1500 or 1600 is provided between each pair of bit lines. Therefore, there is a problem in that the area of the sense amplifier is considerably increased in order to produce a ferroelectric memory having ensured high reliability and operation stability by the method disclosed in Japanese Laid-open Publication No. 11-149796.

SUMMARY OF THE INVENTION

According to one aspect of the present invention, a ferroelectric storage device comprises a memory cell including a first ferroelectric capacitor and connected to a first bit line, wherein the memory cell memorizes data based on a polarization of the first ferroelectric capacitor, and the memory cell outputs a first amount of electric charge generated by a change in the polarization of the first ferroelectric capacitor to the first bit line in reading out the data, a reference cell including a second ferroelectric capacitor and connected to a second bit line, wherein the reference cell outputs as a reference level a second amount of electric charge generated by a change in the polarization of the second ferroelectric capacitor to the second bit line, an amplifier for comparing the first amount of electric charge with the second amount of electric charge to read out data, a first amount-of-electric-charge setting section for setting the first amount of electric charge to an arbitrary level, and a second amount-of-electric-charge setting section for setting the second amount of electric charge to an arbitrary level.

In one embodiment of the present invention, at least one of the first and second amount-of-electric-charge setting sections applies a voltage to at least one of the first and second ferroelectric capacitors so that at least one of the first and second amounts of electric charge is set to an arbitrary level.

In one embodiment of the present invention, the first and second amount-of-electric-charge setting sections consist of an input pad or an input pin capable of externally receiving an arbitrary potential.

In one embodiment of the present invention, when a pulse is applied to an electrode at one side of the first ferroelectric capacitor so that the data is read out or written, the first and second amount-of-electric-charge setting sections adjust a potential of at least one of an "H" level and an "L" level of the pulse.

In one embodiment of the present invention, the setting of the first and second amount-of-electric-charge setting sections is performed at least one of when the data is read out and when the data is written.

According to another aspect of the present invention, a method is provided for testing the above-described ferroelectric storage device. In the method, a memory cell having a small margin is detected by changing the voltage applied to the ferroelectric storage device in such a manner as to reduce the first amount of electric charge.

According to another aspect of the present invention, a method is provided for testing the above-described ferroelectric storage device. In the method, a memory cell having a small margin is detected by changing a voltage applied to the ferroelectric storage device in such a manner as to reduce a difference between the first amount of electric charge and the second amount of electric charge.

According to another aspect of the present invention, a ferroelectric storage device comprises a memory cell including a first ferroelectric capacitor and connected to a first bit line, wherein the memory cell memorizes data based on a polarization of the first ferroelectric capacitor, and the memory cell outputs a first amount of electric charge generated by a change in the polarization of the first ferroelectric capacitor to the first bit line in reading out the data, a reference level generation circuit connected to a second bit line, for generating a second amount of electric charge as a reference level to be output to the second bit line, an amplifier for comparing the first amount of electric charge with the second amount of electric charge to read out data, and at least one amount-of-electric-charge setting section for setting at least one of the first amount of electric charge and the second amount of electric charge to an arbitrary level.

In one embodiment of this invention, the at least one amount-of-electric-charge setting section applies a voltage to at least one of the first and second ferroelectric capacitors so that at least one of the first and second amounts of electric charge is set to an arbitrary level.

In one embodiment of this invention, the at least one amount-of-electric-charge setting section consists of an input pad or an input pin capable of externally receiving an arbitrary potential.

In one embodiment of this invention, when a pulse is applied to an electrode at one side of the first ferroelectric capacitor so that the data is read out or written, the at least one amount-of-electric-charge setting section adjusts a potential of at least one of an "H" level and an "L" level of the pulse.

In one embodiment of this invention, the setting of the at least one amount-of-electric-charge setting section is performed at least one of when the data is read out and when the data is written.

According to another aspect of the present invention, a method is provided for testing the above-described ferroelectric storage device. In the method, a memory cell having a small margin is detected by changing a voltage applied to the ferroelectric storage device in such a manner as to reduce the first amount of electric charge.

According to another aspect of the present invention, a method is provided for testing the above-described ferroelectric storage device. In the method, a memory cell having a small margin is detected by changing a voltage applied to the ferroelectric storage device in such a manner as to reduce a difference between the first amount of electric charge and the second amount of electric charge.

According to another aspect of the present invention, a ferroelectric storage device comprises a memory cell including first and second ferroelectric capacitors and connected to first and second bit lines, wherein the memory cell memorizes data based on polarizations of the first and second ferroelectric capacitors, and in reading out the data, the memory cell outputs a first amount of electric charge generated by a change in the polarization of the first ferroelectric capacitor to the first bit line, and outputs a second amount of electric charge generated by a change in the polarization of the second ferroelectric capacitor to the second bit line, an amplifier for comparing the first amount of electric charge with the second amount of electric charge to read out data, and at least one amount-of-electric-charge setting section for setting at least one of the first amount of electric charge and the second amount of electric charge to an arbitrary level.

In one embodiment of this invention, the at least one amount-of-electric-charge setting section applies a voltage to at least one of the first and second ferroelectric capacitors so that at least one of the first and second amounts of electric charge is set to an arbitrary level.

In one embodiment of this invention, the at least one amount-of-electric-charge setting section consists of an input pad or an input pin capable of externally receiving an arbitrary potential.

In one embodiment of this invention, when a pulse is applied to an electrode at one side of each of the first and second ferroelectric capacitors so that the data is read out or written, the at least one amount-of-electric-charge setting section adjusts a potential of at least one of an "H" level and an "L" level of the pulse.

In one embodiment of this invention, the setting of the at least one amount-of-electric-charge setting section is performed at least one of when the data is read out and when the data is written.

According to another aspect of the present invention, a method is provided for testing the above-described ferroelectric storage device. In the method, a memory cell having a small margin is detected by changing a voltage applied to the ferroelectric storage device in such a manner as to reduce the first amount of electric charge.

According to another aspect of the present invention, a method is provided for testing the above-described ferroelectric storage device. In the method, a memory cell having a small margin is detected by changing a voltage applied to the ferroelectric storage device in such a manner as to reduce a difference between the first amount of electric charge and the second amount of electric charge.

Hereinafter, functions of the present invention will be described.

In Japanese Laid-open Publication No. 11-149796, an offset is provided in a sense amplifier so as to detect a memory cell in which only a potential less than or equal to the offset can be detected. The present invention provides a method for adjusting the amount of electric charge output from a ferroelectric capacitor to a bit line.

In a 1T1C-type ferroelectric memory, a readout margin for a memory cell can be intentionally reduced by: (1) making it possible to externally adjust an output level (reference level) of a reference cell or a reference level generation circuit using a test circuit (potential generation circuit), an input pin (test pin), an input pad (test pad), or the like; (2) making it possible to externally adjust the potential of a pulse applied to a plate line using a test circuit, an input pin, an input pad, or the like, where a reference level is fixed, so that the amount of electric charge read out from a memory cell in testing is reduced; or (3) adjusting a level applied to a bit line in writing.

In a 2T2C-type ferroelectric memory, a readout margin for a memory cell can be intentionally reduced by: (1) making it possible to externally adjust the potential of a pulse applied to a plate line using a test circuit, an input pin, an input pad, or the like, where a reference cell is not used, so that the amount of electric charge read out from a memory cell in testing is reduced and the difference in level between a pair of bit lines is reduced; or (2) adjusting a level applied to a bit line in writing.

According to the present invention, a ferroelectric storage device which can use the sense amplifier 1500 can be designed only by providing a simple peripheral circuit, i.e., a test circuit (potential generation circuit) or providing a test pin or a test pad through which an arbitrary voltage can be externally input. The area of the test circuit, the test pin, the test pad, or the like is much smaller than the area of a sense amplifier. Therefore, as is different from conventional technology, a ferroelectric storage device including a memory cell having a small margin can be rejected without expansion of the area of a sense amplifier.

Thus, the invention described herein makes possible the advantages of providing a small-size ferroelectric storage device and a test method thereof, in which a memory cell having a small readout margin can be detected.

These and other advantages of the present invention will become apparent to those skilled in the art upon reading and understanding the following detailed description with reference to the accompanying figures.

BRIEF DESCRIPTION OF THE DRAWINGS

FIG. 3 is a diagram showing a 1T1C-type ferroelectric memory 200 according to Example 2 of the present invention.

FIG. 4 is a timing chart used for explaining an operation of the 1T1C-type ferroelectric memory 200 of Example 2.

FIG. 6 is a timing chart used for explaining an operation of the 2T2C-type ferroelectric memory 300 of Example 3.

FIG. 7 is a diagram showing a circuit of a conventional 1T1C-type ferroelectric memory 700.

FIG. 8 is a timing chart used for explaining an operation of the conventional 1T1C-type ferroelectric memory 700.

FIG. 9 is a diagram showing a circuit of another conventional 1T1C-type ferroelectric memory 900.

FIG. 10 is a timing chart used for explaining an operation of the other conventional 1T1C-type ferroelectric memory 900.

FIG. 11 is a diagram showing a circuit of a conventional 2T2C-type ferroelectric memory 1100.

FIG. 12 is a timing chart used for explaining an operation of the conventional 2T2C-type ferroelectric memory 1100.

FIG. 13 is a diagram showing a hysteresis loop exhibiting a characteristic of a ferroelectric capacitor.

FIG. 14 is a diagram showing a structure of a memory cell of a ferroelectric storage device.

FIG. 15 is a diagram showing a typical latch sense amplifier 1500.

FIG. 16 is a diagram showing a latch sense amplifier 1600 described in Japanese Laid-open Publication No. 11-149796.

DESCRIPTION OF THE PREFERRED EMBODIMENTS

Hereinafter, the present invention will be described by way of illustrative examples with reference to the accompanying drawings.

EXAMPLE 1

In Example 1, a description is given of when the present invention is applied to a 1T1C-type ferroelectric memory.

Figure 1:
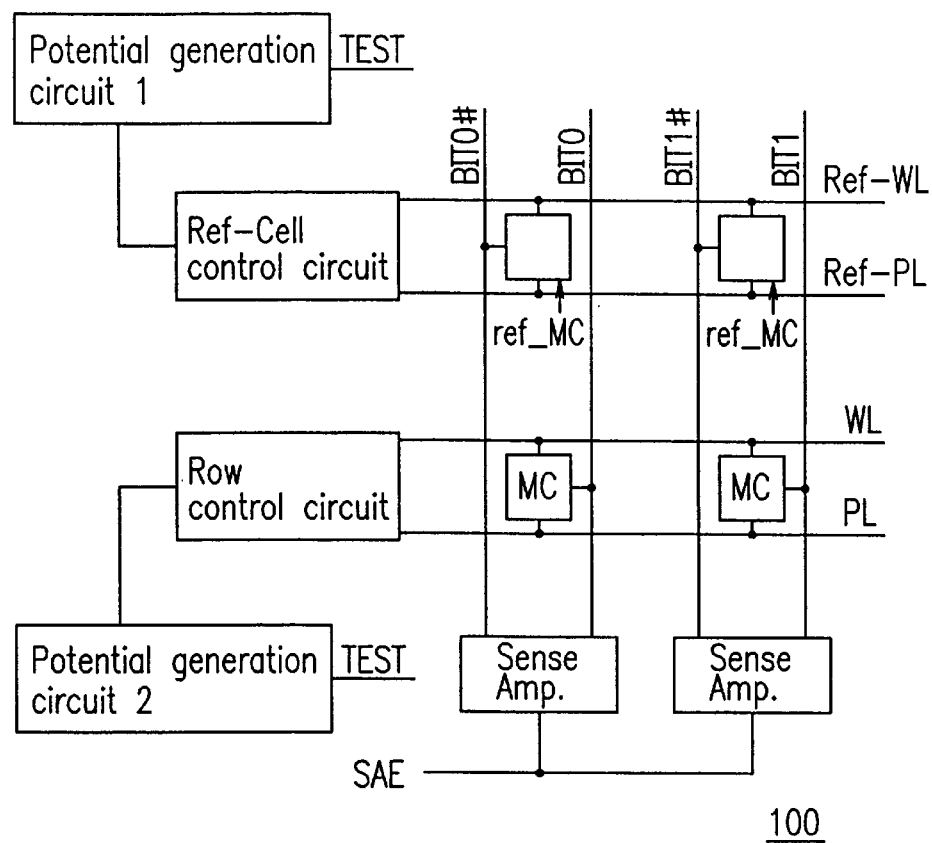
FIG. 1 is a diagram showing a 1T1C-type ferroelectric memory 100 according to Example 1 of the present invention.
Figure 2:
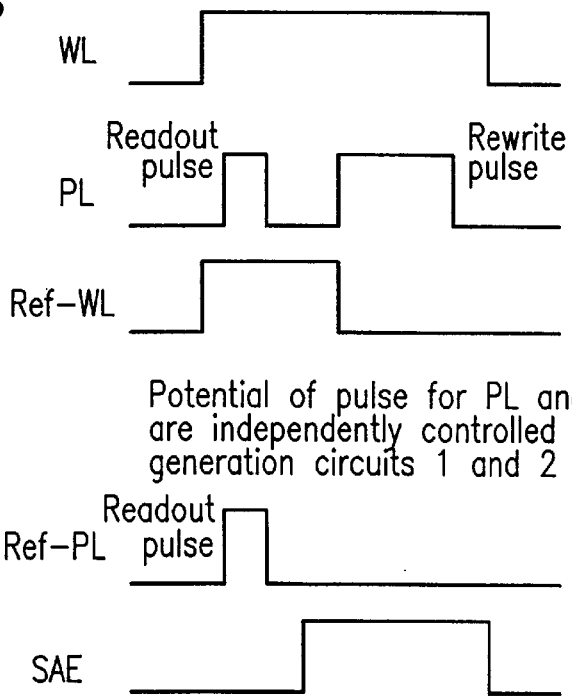
FIG. 2 is a timing chart used for explaining an operation of the 1T1C-type ferroelectric memory 100 of Example 1.

FIG. 1 shows a 1T1C-type ferroelectric memory 100 according to Example 1 of the present invention. FIG. 2 is a timing chart used for explaining an operation of the 1T1C-type ferroelectric memory 100 of Example 1. The 1T1C-type ferroelectric memory 100 of Example 1 is obtained by improving the conventional 1T1C-type ferroelectric memory 700. A difference with the conventional 1T1C-type ferroelectric memory 700 is that the 1T1C-type ferroelectric memory 100 includes two potential generation circuits 1 and 2 for generating different potentials. The potential generation circuits 1 and 2 can be obtained using a simple known circuit. For example, an arbitrary potential can be generated when a plurality of resistors are connected in series between a power source and a GND, and a potential is taken from a connecting node between each resistor.

The two potential generation circuits 1 and 2 adjust the "H" level of a pulse (readout pulse or rewrite pulse) to be applied to the plate line PL for driving the memory cell MC and the plate line Ref_PL for driving the reference memory cell Ref_MC. In Example 1, a signal applied to the word line WL is generated by the Row control circuit, and a signal applied to the reference word line Ref_WL is generated by the Ref_Cell Row control circuit. Identical, signals are output in normal READ and WRITE operations, and a test mode. The 1T1C-type ferroelectric memory 100 is provided with the potential generation circuits 1 and 2 so that different pulses can be applied to the reference cell ref_MC and the memory cell MC.

The potential generation circuits 1 and 2 can generate the same potential so that the same pulse can be applied to the plate line Ref_PL for driving the reference memory cell Ref_MC and the plate line PL for driving the memory cell MC. In normal READ and WRITE operations, the same pulse is applied to the plate line Ref_PL for driving the reference cell ref_MC and the plate line PL for driving the memory cell MC. Therefore, the memory cell MC outputs the "H" or "L" data. The reference memory cell Ref_MC outputs data having a reference level (data having an intermediate level between the "H" data and the "L" data). In a READ operation, the reference-level data is amplified by the sense amplifier. In a WRITE operation, data is written to the memory cell MC via a bit line from the external. The generation of the same potential (typically, a VCC level) by the potential generation circuits 1 and 2 allows the same read and write operations as those of conventional devices.

In testing, a test mode is created by applying a test signal TEST to a test pin or a test pad (not shown). In the test mode, the potential generation circuits 1 and 2 generate different potentials. The different potentials are the "H" levels of the pulses to be applied to the plate line PL for driving the memory cell MC and the plate line Ref_PL for driving the reference memory cell Ref_MC, respectively. Therefore, in READ and WRITE operations, a ferroelectric capacitor constituting a reference cell and a ferroelectric capacitor constituting a memory cell can be set to different potentials. The higher the voltage applied to a ferroelectric capacitor, the more the electric charge is output from the ferroelectric capacitor.

For example, it is assumed that in TEST, a potential applied to a ferroelectric capacitor constituting a memory cell is fixed (to the same potential as that in normal READ and WRITE operations). In this case, when a potential lower than an applied potential in normal READ and WRITE operations is applied to a ferroelectric capacitor constituting a reference memory cell, the levels of the "H" data and the "L" data output from the memory cell are the same as those in normal READ and WRITE operations, and only the reference level of data output from the reference cell is decreased. Therefore, the readout margin for the "L" data is reduced. Further, when a potential higher than the applied potential in normal READ and WRITE operations is applied to the ferroelectric capacitor constituting the reference memory cell, the levels of the "H" data and the "L" data output from the memory cell are the same as that in normal READ and WRITE operations, and only the reference level of data output from the reference cell is increased. Therefore, the readout margin for the "H" data is reduced.

For example, when in TEST, a potential applied to a ferroelectric capacitor constituting a reference memory cell is fixed (to the same potential as that in normal READ and WRITE operations), if a potential lower than an applied potential in normal READ and WRITE operations is applied to a ferroelectric capacitor constituting a memory cell, the amount of electric charge output from the memory cell is decreased while the reference level is maintained. Therefore, the readout margin for the "H" data is reduced. Further, if a potential higher than the applied potential in normal READ and WRITE operations is applied to the ferroelectric capacitor constituting the memory cell, the amount of electric charge output from the memory cell is increased. Therefore, the readout margin for the "L" data is reduced.

Figure 17:
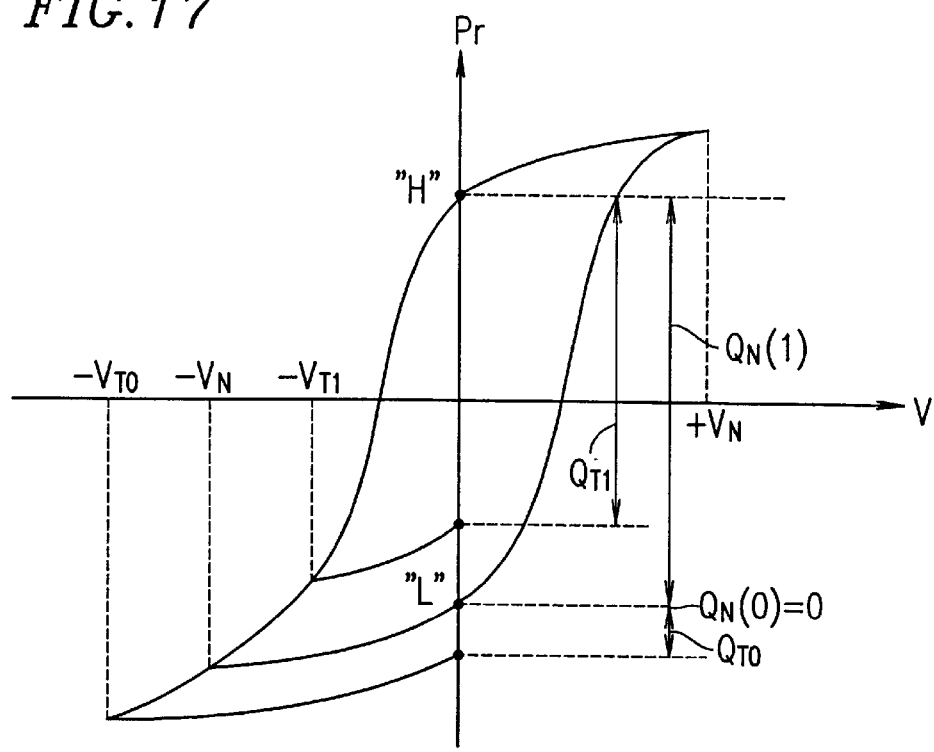
FIG. 17 is a diagram used for explaining a characteristic of a ferroelectric capacitor when the potential of a plate line is changed in a READ operation.

FIG. 17 is a diagram used for explaining a characteristic of a ferroelectric capacitor when the potential of a plate line is changed in a READ operation. The horizontal axis indicates a voltage V applied between both electrode ends of the ferroelectric capacitor. The vertical axis indicates the amount of polarization Pr.

For example, potentials applied to the ferroelectric capacitor in normal READ and WRITE operations are represented by $\pm V_N$. Applied potentials in a READ operation (information readout) in a margin test are represented by $V_{T0}$ and $V_{T1}$. In the margin test, a potential of a plate line is modified in a READ operation. In this case, electric charge output from the ferroelectric capacitor in a normal READ operation are represented by $Q_N(0)$ ("L" data) and $Q_N(1)$ ("H" data), and electric charge output from the ferroelectric capacitor in which the potential of the plate line is changed in a READ operation in the margin test are represented by $Q_{T0}(0)$ ("L" data) and $Q_{T1}(1)$ ("H" data).

Figure 18:
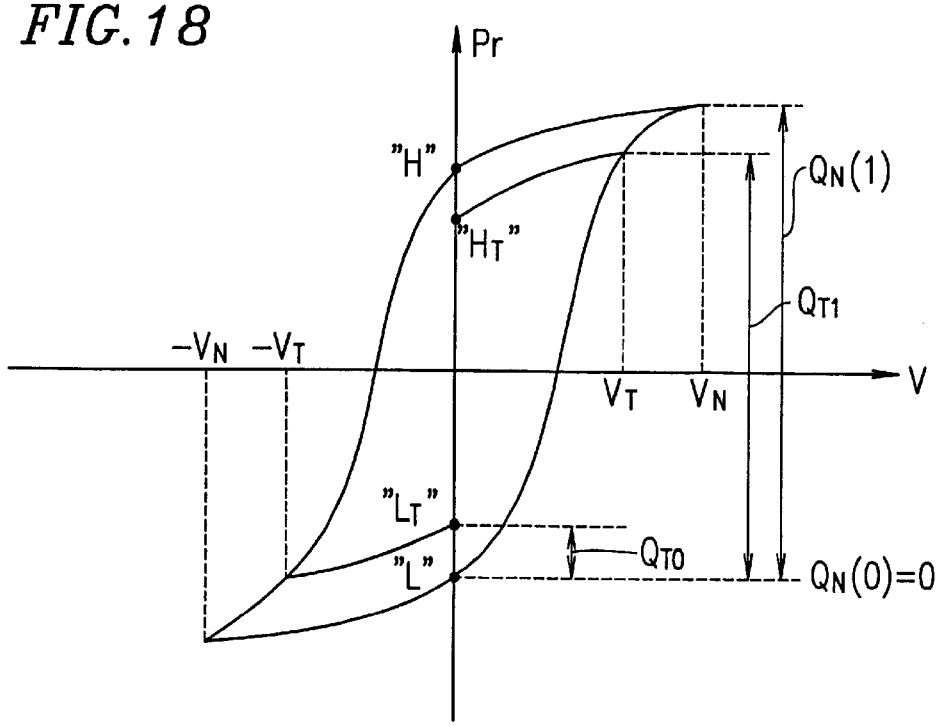
FIG. 18 is a diagram used for explaining a characteristic of a ferroelectric capacitor when the potential of a plate line or a bit line is changed in a WRITE operation.

FIG. 18 is a diagram used for explaining a characteristic of a ferroelectric capacitor when the potential of a plate line or a bit line is changed in WRITE. The horizontal axis indicates a voltage V applied between both electrode ends of the ferroelectric capacitor. The vertical axis indicates the amount of polarization Pr.

For example, potentials applied to the ferroelectric capacitor in normal READ and WRITE operations are represented by $\pm V_N$. Applied potentials in WRITE (information write) in a margin test are represented by $V_{T0}$ and $V_{T1}$. In the margin test, a potential of a plate line or a bit line is modified in WRITE. In this case, electric charge output from the ferroelectric capacitor in a normal READ operation in the margin test is represented by $Q_N(0)$ ("L" data) and $Q_N(1)$ ("H" data), and electric charge output from the ferroelectric capacitor (one of the memory cell and the reference cell) in which the potential of the plate line is changed in a READ operation in the margin test is represented by $Q_{T0}(0)$ ("$L_T$" data) and $Q_{T1}(1)$ ("$H_T$" data).

Figure 19A:
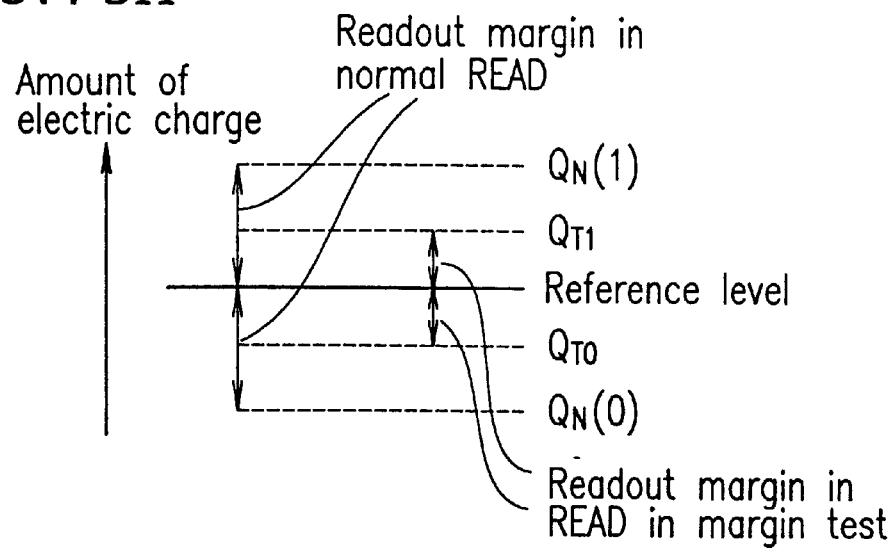
FIG. 19A is a diagram showing a 1T1C-type ferroelectric memory, used f or explaining a relationship between a readout margin in a normal READ operation and a readout margin in a READ operation in a margin test.
Figure 19B:
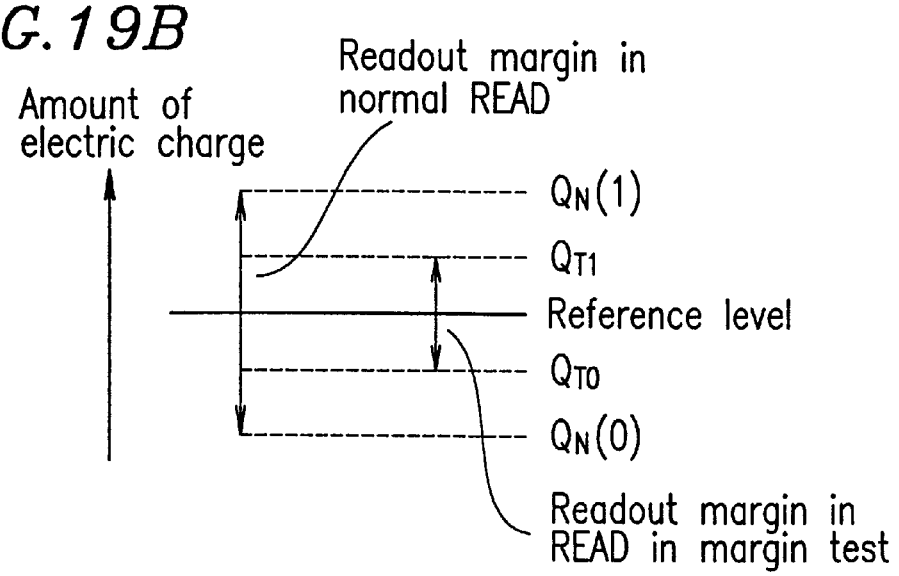
FIG. 19B is a diagram showing a 2T2C-type ferroelectric memory, used for explaining a relationship between a readout margin in a normal READ operation and a readout margin in a READ operation in a margin test.

FIGS. 19A and 19B are diagrams used for explaining a relationship between a readout margin in a normal READ operation and a readout margin in a READ operation in a margin test. FIG. 19A shows a 1T1C-type ferroelectric memory. As shown in FIG. 19A, the readout margin in a READ operation in the margin test is decreased as compared with the readout margin in a normal READ operation. Note that in FIG. 19A, a double-headed arrow above a reference level represents the readout margin of the "H" data, and a double-headed arrow below the reference level represents the readout margin of the "L" data.

When the ferroelectric storage device of Example 1 is subjected to a readout test in this situation, a margin test can be performed under more stringent conditions so that a memory cell having a small margin can be detected. Therefore, a ferroelectric storage device including a memory cell having a small margin can be rejected.

In Example 1, one or more ferroelectric capacitors may be included in a reference cell. When there are two ferroelectric capacitors in a reference cell, data having an intermediate level (reference level) between the "H" data and the "L" data can be produced by short-circuiting the "H" data and the "L" data output from the respective ferroelectric capacitors. Further, four ferroelectric capacitors may be provided in a reference cell. In this case, variations in data having a reference level can be suppressed by short-circuiting the "H" data output from two of the four ferroelectric capacitors and the "L" data output from the other two. Similarly, the number of ferroelectric capacitors may be increased like 8, 16, ... Note that when a single ferroelectric capacitor is used to provide a reference level, the capacitor is decreased so that data having an intermediate level between the "H" data and the "L" data can be output.

EXAMPLE 2

In Example 2, a description is given of when the present invention is applied to a 1T1C-type ferroelectric memory other than that of Example 1.

FIG. 3 shows a 1T1C-type ferroelectric memory 200 according to Example 2 of the present invention. FIG. 4 is a timing chart used for explaining an operation of the 1T1C-type ferroelectric memory 200 of Example 2. The 1T1C-type ferroelectric memory 200 of Example 2 is obtained by improving the conventional 1T1C-type ferroelectric memory 900. A difference with the conventional 1T1C-type ferroelectric memory 900 is that the 1T1C-type ferroelectric memory 200 includes two potential generation circuits 1 and 2 for generating different potentials. The potential generation circuits 1 and 2 can be obtained using a known circuit, similar to Example 1.

The two potential generation circuits 1 and 2 adjust the "H" level of a pulse (readout pulse or rewrite pulse) to be applied to the plate line PL for driving the memory cell MC and a reference level generated by a Ref_Level generation circuit. In Example 2, a signal applied to the word line WL is generated by a Row control circuit, and identical signals are output in normal READ and WRITE operations, and a test mode.

In normal READ and WRITE operations, a typical pulse is applied to a plate line PL for driving the memory cell MC. Therefore, the "H" data or the "L" data is output from the memory cell MC to bit lines BIT0 and BIT1. Further, data having a reference level which is an intermediate level between the "H" data or the "L" data is output from the Ref_Level generation circuit to bit lines BIT0# and BIT1#. In a READ operation, the data having the reference level is amplified by a sense amplifier. In WRITE, data is written to the memory cell MC via the bit line from the external. The generation of the same potential (typically, a VCC level) by the potential generation circuits 1 and 2 allows the same read and write operations as those of conventional devices.

In testing, a test mode is created by applying a test signal TEST to a test pin or a test pad (not shown). In the test mode, using the potential generation circuit 2, the potential of a pulse applied to a plate line PL connected to a memory cell is the same in normal READ and WRITE operations so that a potential output from the memory cell is the same in normal READ and WRITE operations. Further, using the potential generation circuit 1, the potential of the reference level generated by the Ref_Level generation circuit is adjusted (the reference level is intermediate between the "H" level and the "L" level in normal READ and WRITE operations).

For example, in TEST, when the reference level is increased to a level higher than that in normal READ and WRITE operations, the readout margin for the "H" data in the memory cell is decreased. In contrast, when the reference level is decreased to a level lower than that in normal READ and WRITE operations, the readout margin for the "L" data in the memory cell is decreased.

For example, when the reference level is fixed (to the same level as that in normal READ and WRITE operations), if the "H" level of the pulse applied to the plate line PL connected to the memory cell is changed, a voltage applied between both ends of a ferroelectric capacitor can be changed. The higher the voltage applied between both ends of a ferroelectric capacitor, the more the electric charge is output from the ferroelectric capacitor.

For example, when the potential of the pulse applied to the plate line PL connected to the memory cell is increased, the amount of electric charge output from the memory cell is increased. In this case, the reference level is not changed, so that the readout margin for the "L" data in the memory cell is decreased. Further, when the potential of the pulse applied to the plate line PL connected to the memory cell is decreased, the amount of electric charge output from the memory cell is decreased. In this case, the reference level is not changed, so that the readout margin for the "H" data in the memory cell is decreased.

Therefore, similar to FIGS. 17 to 19A in Example 1, a readout margin in a READ operation in a margin test is smaller than a readout margin in a normal READ operation.

When the ferroelectric storage device of Example 2 is subjected to a readout test in this situation, a margin test can be performed under more stringent conditions so that a memory cell having a small margin can be detected. Therefore, a ferroelectric storage device including a memory cell having a small margin can be rejected.

EXAMPLE 3

In Example 3, a description is given of when the present invention is applied to a 2T2C-type ferroelectric memory.

Figure 5A:
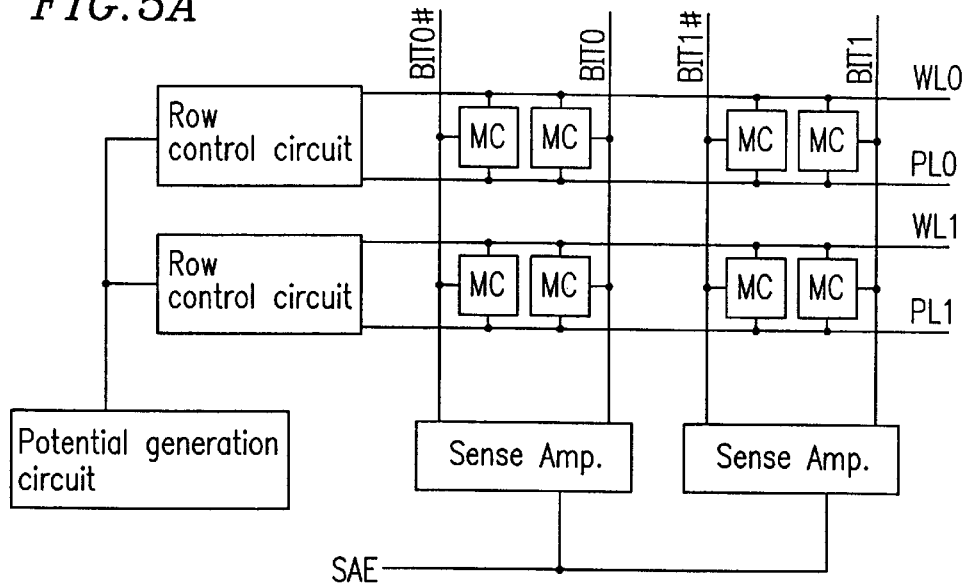
FIG. 5A is a diagram showing a 2T2C-type ferroelectric memory 300 according to Example 3 of the present invention.

FIG. 5A shows a 2T2C-type ferroelectric memory 300 according to Example 3 of the present invention. FIG. 6 is a timing chart used for explaining an operation of the 2T2C-type ferroelectric memory 300 of Example 3.

The 2T2C-type ferroelectric memory 300 of Example 3 is obtained by improving the conventional 2T2C-type ferroelectric memory 1100. A difference with the conventional 2T2C-type ferroelectric memory 1100 is that the 2T2C-type ferroelectric memory 300 includes a potential generation circuit for generating different potentials. The potential generation circuit can be obtained using a simple known circuit, similar to Example 1.

The potential generation circuit adjusts the potential of the "H" level of a pulse (readout pulse or rewrite pulse) applied to plate lines PL0 and PL1.

In normal READ and WRITE operations, the potential generation circuit generates the potential of a VCC level so that the potential of the "H" level of the plate line is VCC. In the 2T2C-type ferroelectric memory 300, one memory cell includes two ferroelectric capacitors. One of the two ferroelectric capacitors induces electric charge on bit lines BIT0 and BIT1. The other ferroelectric capacitor induces electric charge on bit lines BIT0# and BIT1#. The difference in potential between both bit lines is read out. Therefore, a reference cell is not used in the 2T2C-type ferroelectric memory 300.

In testing, a test mode is created by applying a test signal to a test pin or a test pad. In the test mode, the potential generation circuit generates a potential lower than the VCC so that the above-described difference in potential is smaller than that in normal READ and WRITE operations. Thereby, the potentials of both the "H" data and the "L" data are decreased, the difference in potential between the "H" data and the "L" data is reduced. In the 2T2C-type ferroelectric memory 300, since the difference in potential between the "H" data and the "L" data is amplified by a sense amplifier, a readout margin is reduced for both the "H" data and the "L" data.

Similar to the cases of FIGS. 17 and 18 in Example 1, electric charge output from the ferroelectric capacitor in a normal READ operation is represented by $Q_N(0)$ ("L" data) and $Q_N(1)$ ("H" data), and electric charge output from the ferroelectric capacitor in which the potential of the plate line is changed in a READ operation in the margin test is represented by $Q_{T0}(0)$ ("L" data) and $Q_{T1}(1)$ ("H" data).

Therefore, as shown in FIG. 19B, a readout margin in a READ operation in a margin test is smaller than a readout margin in a normal READ operation.

When the ferroelectric storage device of Example 3 is subjected to a readout test in this situation, a margin test can be performed under more stringent conditions so that a memory cell having a small margin can be detected. Therefore, a ferroelectric storage device including a memory cell having a small margin can be rejected.

EXAMPLE 4

In Example 4, a description is given of when the present invention is applied to a 2T2C-type ferroelectric memory other than that of Example 3.

Figure 5B:
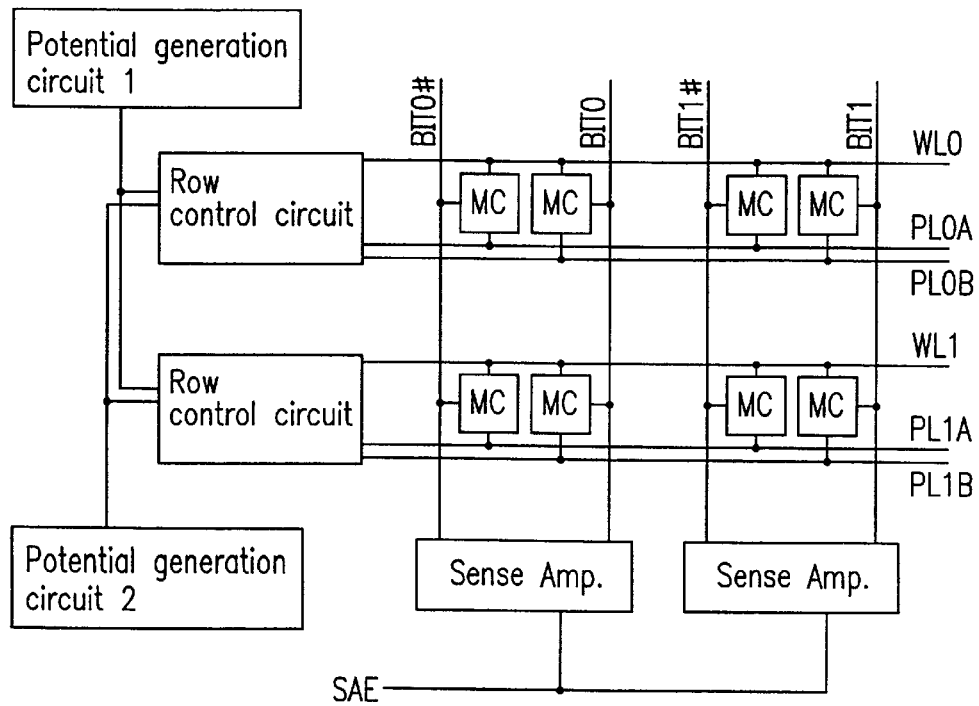
FIG. 5B is a diagram showing a 2T2C-type ferroelectric memory 400 according to Example 4 of the present invention.

FIG. 5B shows a 2T2C-type ferroelectric memory 400 according to Example 4 of the present invention.

As is different from the 2T2C-type ferroelectric memory 300, the 2T2C-type ferroelectric memory 400 includes two plate lines PL0A and PL0B, or two plate lines PL1A and PL1B, for each word line. Therefore, potential generating circuits 1 and 2 can provide different pulse potentials.

In the 2T2C-type ferroelectric memory 400, two ferroelectric capacitors output data inverse to each other to a pair of bit lines (e.g., BIT0 and BIT0#, BIT1 and BIT1#), respectively. Specifically, when one of the two ferroelectric capacitors connected to the bit line BIT0 or BIT1 outputs the "H" data, the other ferroelectric capacitor connected to the bit line BIT0# or BIT1# outputs the "L" data.

In normal READ and WRITE operations, the same pulse is applied to both the two ferroelectric capacitor connected to the bit line BIT0 or BIT1 and the ferroelectric capacitor connected to the bit line BIT0# or BIT1#.

Further, in testing, a pulse having a low potential is applied to a ferroelectric capacitor in which the "H" data is written, and a pulse having a high potential is applied to a ferroelectric capacitor in which the "L" data is written. Therefore, the potential of the "H" data applied to a bit line is lower and the potential of the "L" data applied to a bit line is higher, in testing than in normal READ and WRITE operations. In the 2T2C-type ferroelectric memory 400, the difference in potential between the "H" data and the "L" data is amplified by a sense amplifier. In the test mode, the difference in potential between the "H" data and the "L" data is reduced, whereby a readout margin is reduced for both the "H" data and the "L" data.

Similar to the cases of FIGS. 17 and 18 in Example 1, electric charge output from the ferroelectric capacitor in a normal READ operation is represented by $Q_N(0)$ ("L" data) and $Q_N(1)$ ("H" data), and electric charge output from the ferroelectric capacitor in which the potential of the plate line is changed in a READ operation in the margin test is represented by $Q_{T0}(0)$ ("L" data) and $Q_{T1}(1)$ ("H" data). Therefore, as shown in FIG. 19B, a readout margin in a READ operation in a margin test is smaller than a readout margin in a normal READ operation.

When the ferroelectric storage device of Example 3 is subjected to a readout test in this situation, a margin test can be performed under more stringent conditions so that a memory cell having a small margin can be detected. Therefore, a ferroelectric storage device including a memory cell having a small margin can be rejected.

Note that besides the method described in Examples 1 through 4, there is a method for intentionally reducing a readout margin in a test mode in accordance with a similar concept.

In Examples 1 through 4, the "L" level of a pulse applied to a plate line is set to a GND, and the "H" level is a potential generated by a potential generation circuit. Alternatively, potentials applied to both ends of a ferroelectric capacitor may be changed. To this end, the difference between the "L" level and the "H" level of the pulse applied to the plate line may be changed. Therefore, even when the "L" level of the pulse applied to the plate line is set to the potential generated by the potential generation circuit and the "H" level is set to VCC, a similar margin test can be performed. Further, when the "L" level and the "H" level of the pulse applied to the plate line are both generated by the potential generation circuit, a similar margin test can be performed.

A target potential is generated by a potential generation circuit in order to adjust the potential of a plate line (Examples 1 through 4) and to adjust the level of a potential generated by a reference level generation circuit (Example 2). However, even when a potential is supplied directly from a test pad or a test pin, the same effect can be obtained.

In Examples 1 through 4, the potential of a plate line is adjusted in both READ and WRITE operations. Alternatively, the adjustment may be performed only in a READ operation or in a WRITE operation, whereby a similar margin test can be performed.

Further, in Examples 1 through 4, the rejection of a memory cell having a small margin is performed when the amount of electric charge output to a bit line is reduced by adjusting the level of a pulse applied to a plate line. Alternatively, the potential of a bit line may be adjusted in WRITE, whereby a similar margin test can be performed. For example, when the "H" data is written, the level of a bit line may be lower than VCC although the level of the bit line is typically a VCC level. Alternatively, when the "L" data is written, the level of a bit line may be higher than GND although the level of the bit line is typically a GND level. In this manner, by adjusting the potential of a bit line, an effect similar to when the level of a pulse applied to a plate line can be obtained only in WRITE. The adjustment of the potential of a bit line can be performed, as shown in FIG. 18, using a potential generation circuit or a test pad, in a manner similar to that in the adjustment of the potential of a plate line.

Note that the present invention is not limited to the above-described examples. A memory cell having a small margin can be detected by adjusting the amount of electric charge output from a ferroelectric capacitor, using any method. Further, a ferroelectric storage device including a detected memory cell having a small margin can be rejected.

As described above, according to the present invention, a margin test can be performed under a more stringent condition so that a memory cell having a small margin can be detected in a readout test for a ferroelectric storage device. Therefore, a ferroelectric storage device including a detected memory cell having a small margin can be rejected, thereby making it possible to ensure high reliability and operation stability of the ferroelectric storage device. The present invention is effective for both 1T1C-type and 2T2C-type ferroelectric storage devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ferroelectric storage device, comprising:

a memory cell including a first ferroelectric capacitor and connected to a first bit line, wherein the memory cell memorizes data based on a polarization of the first ferroelectric capacitor, and the memory cell outputs a first amount of electric charge generated by a change in the polarization of the first ferroelectric capacitor to the first bit line in reading out the data;

a reference cell including a second ferroelectric capacitor and connected to a second bit line, wherein the reference cell outputs as a reference level a second amount of electric charge generated by a change in the polarization of the second ferroelectric capacitor to the second bit line;

an amplifier for comparing the first amount of electric charge with the second amount of electric charge to read out data;

a first amount-of-electric-charge setting section for setting the first amount of electric charge to a first arbitrary level; and a second amount-of-electric-charge setting section for setting the second amount of electric charge to a second arbitrary level.

2. A ferroelectric storage device according to claim 1, wherein at least one of the first and second amount-of-electric-charge setting sections applies a voltage to at least one of the first and second ferroelectric capacitors so that at least one of the first and second amounts of electric charge is set respectively to either the first or the second arbitrary level.

3. A ferroelectric storage device according to claim 2, wherein the first and second amount-of-electric-charge setting sections; consist of an input pad or an input pin capable of externally receiving an arbitrary potential.

4. A ferroelectric storage device according to claim 1, wherein when a pulse is applied to an electrode at one side of the first ferroelectric capacitor so that the data is read out or written, the first and second amount-of-electric-charge setting sections adjust a potential of at least one of an "H" level and an "L" level of the pulse.

5. A ferroelectric storage device according to claim 1, wherein the setting of the first and second amount-of-electric-charge setting sections is performed at least one of when the data is read out and when the data is written.

6. A method for testing a ferroelectric storage device according to claim 2, comprising the steps of:

detecting a memory cell having a small margin by changing the voltage applied to the ferroelectric storage device in such a manner as to reduce the first amount of electric charge.

7. A method for testing a ferroelectric storage device according to claim 2, comprising the steps of:

detecting a memory cell having a small margin by changing a voltage applied to the ferroelectric storage device in such a manner as to reduce a difference between the first amount of electric charge and the second amount of electric charge.

8. A ferroelectric storage device, comprising:

a memory cell including a first ferroelectric capacitor and connected to a first bit line, wherein the memory cell memorizes data based on a polarization of the first ferroelectric capacitor, and the memory cell outputs a first amount of electric charge generated by a change in the polarization of the first ferroelectric capacitor to the first bit line in reading out the data;

a reference level generation circuit connected to a second bit line, for generating a second amount of electric charge as a reference level to be output to the second bit line;

an amplifier for comparing the first amount of electric charge with the second amount of electric charge to read out data; and at least one amount-of-electric-charge setting section for setting at least one of the first amount of electric charge and the second amount of electric charge to an arbitrary level.

9. A ferroelectric storage device according to claim 8, wherein the at least one amount-of-electric-charge setting section applies a voltage to at least one of the first and second ferroelectric capacitors so that at least one of the first and second amounts of electric charge is set to the arbitrary level.

10. A ferroelectric storage device according to claim 9, wherein the at least one amount-of-electric-charge setting section consists of an input pad or an input pin capable of externally receiving an arbitrary potential.

11. A ferroelectric storage device according to claim 8, wherein when a pulse is applied to an electrode at one side of the first ferroelectric capacitor so that the data is read out or written, the at least one amount-of-electric-charge setting section adjusts a potential of at least one of an "H" level and an "L" level of the pulse.

12. A ferroelectric storage device according to claim 9, wherein the setting of the at least one amount-of-electric-charge setting section is performed at least one of when the data is read out and when the data is written.

13. A method for testing a ferroelectric storage device according to claim 9, comprising the steps of:

detecting a memory cell having a small margin by changing a voltage applied to the ferroelectric storage device in such a manner as to reduce the first amount of electric charge.

14. A method for testing a ferroelectric storage device according to claim 10, comprising the steps of:

detecting a memory cell having a small margin by changing a voltage applied to the ferroelectric storage device in such a manner as to reduce a difference between the first amount of electric charge and the second amount of electric charge.

15. A ferroelectric storage device, comprising:

a memory cell including first and second ferroelectric capacitors and connected to first and second bit lines, wherein the memory cell memorizes data based on polarizations of the first and second ferroelectric capacitors, and in reading out the data, the memory cell outputs a first amount of electric charge generated by a change in the polarization of the first ferroelectric capacitor to the first bit line, and outputs a second amount of electric charge generated by a change in the polarization of the second ferroelectric capacitor to the second bit line;

an amplifier for comparing the first amount of electric charge with the second amount of electric charge to read out data; and at least one amount-of-electric-charge setting section for setting at least one of the first amount of electric charge and the second amount of electric charge to an arbitrary level.

16. A ferroelectric storage device according to claim 15, wherein the at least one amount-of-electric-charge setting section applies a voltage to at least one of the first and second ferroelectric capacitors so that at least one of the first and second amounts of electric charge is set to the arbitrary level.

17. A ferroelectric storage device according to claim 16, wherein the at least one amount-of-electric-charge setting section consists of an input pad or an input pin capable of externally receiving an arbitrary potential.

18. A ferroelectric storage device according to claim 15, wherein when a pulse is applied to an electrode at one side of each of the first and second ferroelectric capacitors so that the data is read out or written, the at least one amount-of-electric-charge setting section adjusts a potential of at least one of an "H" level and an "L" level of the pulse.

19. A ferroelectric storage device according to claim 15, wherein the setting of the at least one amount-of-electric-charge setting section is performed at least one of when the data is read out and when the data is written.

20. A method for testing a ferroelectric storage device according to claim 16, comprising the steps of:

detecting a memory cell having a small margin by changing a voltage applied to the ferroelectric storage device in such a manner as to reduce the first amount of electric charge.

21. A method for testing a ferroelectric storage device according to claim 16, comprising the steps of:

detecting a memory cell having a small margin by changing a voltage applied to the ferroelectric storage device in such a manner as to reduce a difference between the first amount of electric charge and the second amount of electric charge.

* * * * *